United States Patent [19]

Love

[11] 4,274,936

[45] Jun. 23, 1981

[54] VACUUM DEPOSITION SYSTEM AND METHOD

[75] Inventor: Robert B. Love, Franklin, Tenn.

[73] Assignee: Advanced Coating Technology, Inc., Franklin, Tenn.

[21] Appl. No.: 34,347

[22] Filed: Apr. 30, 1979

[51] Int. Cl.³ .............................................. C23C 15/00
[52] U.S. Cl. .................. 204/192 R; 118/719; 118/729; 204/298
[58] Field of Search ............... 204/192 R, 298; 118/729, 719

[56] References Cited

U.S. PATENT DOCUMENTS

| | | | |
|---|---|---|---|
| 2,925,062 | 2/1960 | Schwindt | 118/718 |
| 3,294,670 | 12/1966 | Charschan et al. | 204/298 |
| 3,521,765 | 7/1970 | Kauffman et al. | 214/17 |
| 3,584,847 | 6/1971 | Hammond, Jr. et al. | 118/729 X |
| 3,673,981 | 7/1972 | Beckham et al. | 118/733 X |
| 3,738,928 | 6/1973 | Glaser et al. | 204/298 |
| 3,852,181 | 12/1974 | Cirkler et al. | 204/298 |
| 3,891,536 | 6/1975 | Glaser et al. | 204/298 |
| 3,907,660 | 9/1975 | Gillery | 204/298 |
| 3,925,182 | 12/1975 | Carmichael et al. | 204/192 |
| 4,015,558 | 4/1977 | Small et al. | 118/729 X |

FOREIGN PATENT DOCUMENTS

| | | |
|---|---|---|
| 2205584 | 5/1974 | France . |
| 1093525 | 12/1967 | United Kingdom . |
| 1189714 | 4/1970 | United Kingdom . |
| 1321640 | 6/1973 | United Kingdom . |
| 1329397 | 9/1973 | United Kingdom . |
| 1339164 | 11/1973 | United Kingdom . |
| 1428340 | 3/1976 | United Kingdom . |
| 1428993 | 3/1976 | United Kingdom . |
| 1469922 | 4/1977 | United Kingdom . |

OTHER PUBLICATIONS

G. F. Barber, Two-Chamber Air-to-Vacuum Lock System, *IBM Technical Disclosure Bulletin*, vol. 11, No. 7, Dec. 1968, pp. 757-758.
Robert W. Berry et al., *Thin Film Technology*, Van Nostrand Reinhold Co., New York, 1968, pp. 60-67.
Walter G. Overacker, Production Scale Electron-Beam Systems for Thin-Film Applications, *Journal of Vacuum Science and Technology*, vol. 8, No. 1, pp. 357-360.
Robert W. Berry et al., *Thin Film Technology*, Van Nostrand Reinhold Co., New York, 1968, pp. 35-37.

*Primary Examiner*—Delbert E. Gantz
*Assistant Examiner*—William Leader
*Attorney, Agent, or Firm*—Watts, Hoffmann, Fisher & Heinke Co.

[57] ABSTRACT

A large scale vacuum deposition facility is disclosed in which substrates, in the form of architectural glass lights on supporting racks, are moved through an evacuated working chamber system where the substrates are coated by cathodic sputtering. The substrate racks are moved by a conveyor system through the working chamber system via an access chamber system, enabling substantially continuous production of coated substrates without requiring the working chamber system be opened to atmosphere.

Operation of the working chamber system, the access chamber system, the conveyor system and associated components is monitored and governed from a process control console.

17 Claims, 6 Drawing Figures

VACUUM DEPOSITION SYSTEM AND METHOD

CROSS REFERENCED APPLICATION

U.S. Ser. No. 971,196 filed Dec. 20, 1978 by Chambers and Wan.

BACKGROUND OF THE INVENTION

1. Field of the Invention

The present invention relates to deposition systems and more particularly to a method and system for vacuum deposition on large scale substrates in evacuated chambers.

Architectural glass which is transparent yet bears a reflective coating has been found highly desirable for use in buildings to reduce solar heating gains as well as for aesthetic purposes. Minor defects in the coatings are readily observable when the glass is installed and accordingly such glass must be provided with coatings which can be applied reliably without defects and remain securely adhered to the glass when it is in use.

Coating substrates, such as glass, by sputtering atoms of coating material onto them has been found to be an effective process for producing high quality relatively durable coatings. To assure optimum efficiency, the sputtering process should be conducted in a chamber under deep vacuum conditions (e.g., pressures of less than 50 microns of mercury). The atmosphere in the chambers should be substantially inert or otherwise chemically controlled, the chamber should be free from contamination and the substrates themselves must be virtually free from surface particles, contaminants, and static electricity to avoid irregularities and/or discontinuities in the coating.

2. Prior Art

The production of sputter coated substrates has been relatively widely used in the semiconductor industry where small scale production equipment can be used; however, because of the extremely deep vacuum pressures required for high quality sputter coating, production of relatively large scale coated substrates, like architectural glass, has required usage of large, expensive pressure vessels and production rates have been relatively limited.

An example of production equipment for coating small scale substrates is disclosed by U.S. Pat. No. 3,294,670 in which substrates are coated on a continuous production basis. These kinds of production facilities are constructed using minimum volume internal vacuum chambers so that appropriate pumps can evacuate them quickly and efficiently. Because of the relatively small size of the equipment the vacuum chamber wall areas are small and not subjected to great differential pressure forces. The continuous production technique tends to minimize the possibilities that substrates will be carrying surface dust, moisture, etc. when entering the sputtering chamber because the substrates can be individually cleaned just before the sputtering takes place.

When large scale substrates are to be sputter coated, problems arising from inefficient use of vacuum pumps, large chamber volumes and extreme differential pressure forces are encountered. Relatively large chamber volumes are necessitated by the substrate sizes and the chambers are thus not quickly evacuable to coating pressure levels of 50 microns of mercury or less. Different kinds of vacuum pumps must be operated in stages to evacuate the chambers to optimum coating pressure levels.

Mechanical vacuum pumps are effective to evacuate the chambers so long as the gas being pumped exhibits fluid flow characteristics. At pressure levels of from 700–500 microns the efficiency of the mechanical pumps is reduced dramatically because the movement of the remaining atmosphere in the chambers begins to take on molecular flow characteristics. This results in substantial reductions in pumping speed as the chambers continue to be evacuated to about 200 microns. Diffusion pumps can then be used to further evacuate the chambers to desired lower pressure levels.

Diffusion pumps, such as oil diffusion pumps, are ineffective when operated at pressures over 200 microns and therefore the chambers have had to be mechanically evacuated to the effective operating range of the diffusion pumps. The time taken to reduce the chamber pressure from 500 to 200 microns has been significant and reduces coating production rates appreciably.

Some production facilities for sputter coating relatively large glass lights have been proposed in which the glass is supported by racks in a large volume pressure vessel equipped with movable sputtering electrodes. The vessel is loaded, closed, and pumped down to the operating level after which the glass is coated, the vessel vented and reopened, and the coated glass removed. Examples of such facilities are disclosed by U.S. Pat. Nos. 3,907,660; 3,891,536; and 3,738,928.

These approaches attempt to reduce the adverse affects on production rates caused by the long pumping times required to suitably evacuate the vessels. In addition the vessels can be of cylindrical or semicylindrical shape which reduces the cost of their construction.

There are some practical drawbacks to these approaches. In addition to the length of time required to simply evacuate these vessels to their operating levels, the vessels are opened to atmosphere between coating operations and a large number of sheets of glass and their supporting structures are placed inside. This further extends the pumping time because substantial numbers of water and oxygen molecules, as well as other contaminants are introduced into and trapped by the vessel walls, the glass itself and its supporting structure. Such contaminants are gradually released and expelled as the pumping chamber pressure is reduced and maintained at a given level. The higher the chamber pressure remains during coating, the more likely it is that such molecules will be present in significant numbers during coating. Opening the vessel to atmosphere between coating operations and replacing the racks etc. replenishes the supply of these contaminants.

The interior of the chambers thus tends to be "dirty", even at exceedingly low pressures. The presence of these molecules can adversely effect the quality of the final coating. Purging the vessels of such molecules by maintaining the coating pressure level for a period of time before coating the glass is desirable; however, this further extends the cycle time.

Moreover, it is sometimes difficult to assure that the substrates remain clean before and during their assembly into the pressure vessels or on the supporting racks. That is to say, each substrate to be coated can not be cleaned immediately before being placed in the vessel and coated. The longer the substrates are exposed to ambient atmosphere and the more handling they receive the more likely it is that contamination will occur.

Attempts to increase the rate of production of coated glass have resulted in some more or less continuous coating facilities. One such proposal is disclosed by U.S. Pat. No. 3,925,182 in which a series of aligned chambers separated by pressure doors is provided and through which the glass is conveyed on suitable supports. The disclosed system employs a coating chamber with entrance and exit chambers on its opposite ends. The chambers are all about the same length and the equipment is designed so that the entrance and coating chambers communicate with each other as the coating process begins and the exit and coating chambers communicate as the coating process ends.

The chambers are mechanically evacuated with the entrance and exit chambers being pressure equalized, respectively, with the coating chamber at different times during each cycle to enable passage of the glass through the apparatus. The pumping time required for operating the equipment through a cycle tends to be reduced by providing minimum volume rectangular cross-section chambers and by operating the system at fairly high coating pressure levels (e.g. in excess of 100 microns); however, the exit and entrance chambers have to be pumped down from atmospheric pressure to the coating pressure level during each cycle. This is relatively time consuming because of the pumping inefficiency not withstanding the relatively small volume chambers.

The operation of this system requires back filling the entrance and exit chambers with inert gas in order to better assure a "clean" atmosphere in the coating chamber when it communicated with the entrance and exit chambers. Nevertheless contaminants can continue to be problems both of the relatively high coating pressure and because the entrance and exit chambers are opened to atmosphere and to the coating chamber during each cycle, enabling contaminants to enter the chambers with the entrance and exit of each batch of substrates and supports.

Providing additional chambers and/or lengthening the chambers relative to the maximum substrate length tends to increase the cost and complexity of the equipment to the extent that such installations are considered uneconomical. In particular, because the chamber volumes are kept as small as possible to increase the pumping rates, the differential pressure forces tending to crush the chamber walls are extremely great and require expensive pressure wall constructions.

SUMMARY OF THE INVENTION

The present invention provides a new and improved method and apparatus for coating large substrates, such as architectural glass lights, wherein the substrates are introduced to and removed from a deep vacuum coating chamber while maintaining extremely low coating chamber pressure levels, contamination of the substrate surfaces and the coating chamber atmosphere is minimized, pumping efficiency is maintained relatively high and capital expenditures required for constructing the equipment are not exceedingly great.

In a preferred form of the invention, access and working chambers are provided for receiving the substrates and their supports. The access chamber is configured to conform as closely as practical to the substrate shape and thus has a relatively small volume while the working chamber is constructed to provide a volume which is substantially greater than that of the access chamber and has walls configured to withstand extreme differential pressure forces with maximum efficiency.

Substrates are moved into the access chamber from ambient atmospheric pressure and the access chamber is sealed off from the ambient atmosphere and from the working chamber. The access chamber is mechanically pumped to reduce the access chamber pressure substantially below atmospheric pressure to a "roughing" vacuum level which is greater than the working chamber pressure, yet within the range of efficient mechanical vacuum pump operation.

The chambers are then communicated with each other resulting in the pressures in the chambers equalizing substantially below the roughing vacuum level and well into the efficient operating range of a diffusion type vacuum pump associated with the working chamber. The substrates are then advanced into the working chamber, the chambers are again isolated from each other and the diffusion pump is operated to reduce the chamber pressure. After coating, the substrates are locked out of the working chamber. The pressure in the working chamber, because of the relatively large working chamber volume, is maintained at a low level throughout the operation of the system.

The large working chamber volume thus aids in increasing the efficiency and speed of the vacuum pumping, and eliminates the need for mechanical pumps to pump out of the working chamber during each coating cycle. Moreover the large volume permits stationing multiple electrodes in the working chamber. These additional electrodes can be used serially to provide for reactive sputtering or placing diverse coatings on the same substrate, or can accommodate replacement sputtering electrodes to lengthen the interval between electrode replacements.

According to the invention the working chamber includes a coating chamber section in which the substrates are coated at extremely low pressures in a controlled atmosphere and an isolation chamber section interposed between the coating chamber and an access chamber. The coating and isolation chamber sections are equipped with individual molecular pumping systems. The isolation chamber section, which has a substantially large volume than the access chamber, is normally maintained at a lower pressure than the coating chamber section so that the isolation chamber section not only coacts with the adjacent access chamber in the manner referred to for increasing pumping efficiency and effectiveness but also improves the cleanliness of substrates and their supports entering the coating chamber section because of the extensive degassing which occurs in the isolation chamber section as the pressure is reduced below the coating chamber section pressure level. Perhaps even more importantly the coating chamber section atmosphere is purged each time a substrate is moved between the coating and isolation chamber sections because of the lower pressure established in the isolation chamber section.

The working chamber is preferably constructed in the form of a cylindrical pressure vessel. The cylindrical pressure wall configuration is inherently stronger in resisting differential pressure forces tending to crush the chamber than are rectilinear walls which must be strongly reinforced. The cost of fabrication of the new system is significantly reduced because of the configuration of the working chamber.

The preferred access chamber configuration is formed by a pressure wall structure defining a relatively narrow elongated chamber having a rectangular cross section. This chamber configuration generally conforms to the substrate shape and thus minimizes the pumping volume so that it can be rapidly evacuated by an associated roughing vacuum pump. The access chamber length just exceeds the maximum length substrate the system is designed to accept and is substantially less than the working chamber length so that the magnitudes of differential pressure forces acting on the access chamber walls are minimized.

A transition wall section extends between the working chamber and the access chamber. The transition wall is formed by panels hermetically bonded to a circular working chamber end wall and converging proceeding away from a rectangular opening in the end wall. The transition wall defines a rectangular internal cross-sectional shape which decreases in height and width proceeding toward the access chamber walls to which the panels are also hermetically bonded. A pressure door seats about the working chamber opening and swings open into the enlarged end of the transition wall section to enable pressure communication of the chambers and unencumbered passage of substrates past the door.

In an illustrated and preferred embodiment of the invention, a system for sputter coating large substrates on a continuous basis is provided having a working chamber system and entrance and exit access chamber systems. The working chamber system is formed by a central coating chamber section and isolation chamber sections through which substrates are introduced into and removed from the coating chamber section. The isolation chamber sections are independently communicable with the coating chamber via pressure doors between them through which substrates are moved. The isolation chamber sections each coact with their respective adjacent access chambers so that substrates can be moved between an access and isolation chamber while other substrates are being coated. The isolation chamber sections are each operated below the coating chamber section pressure except when communicating with their respective access chambers to reduce the chamber pressures into the diffusion pumping range.

The access chambers are communicable and can also be used to partially evacuate each other to reduce pumping time. When one access chamber is at low vacuum pressure preparatory to being vented to atmosphere and the other is atmospheric pressure preparatory to being evacuated, the chambers are communicated so that the air in the higher pressure chamber expands to the evacuated chamber. The chambers are then isolated from each other again for venting and vacuum pumping, respectively.

Other features and advantages of the invention will become apparent from the following description of a preferred embodiment made with reference to the accompanying drawings which form part of the specification.

DESCRIPTION OF A PREFERRED EMBODIMENT

Figures 1, 2:
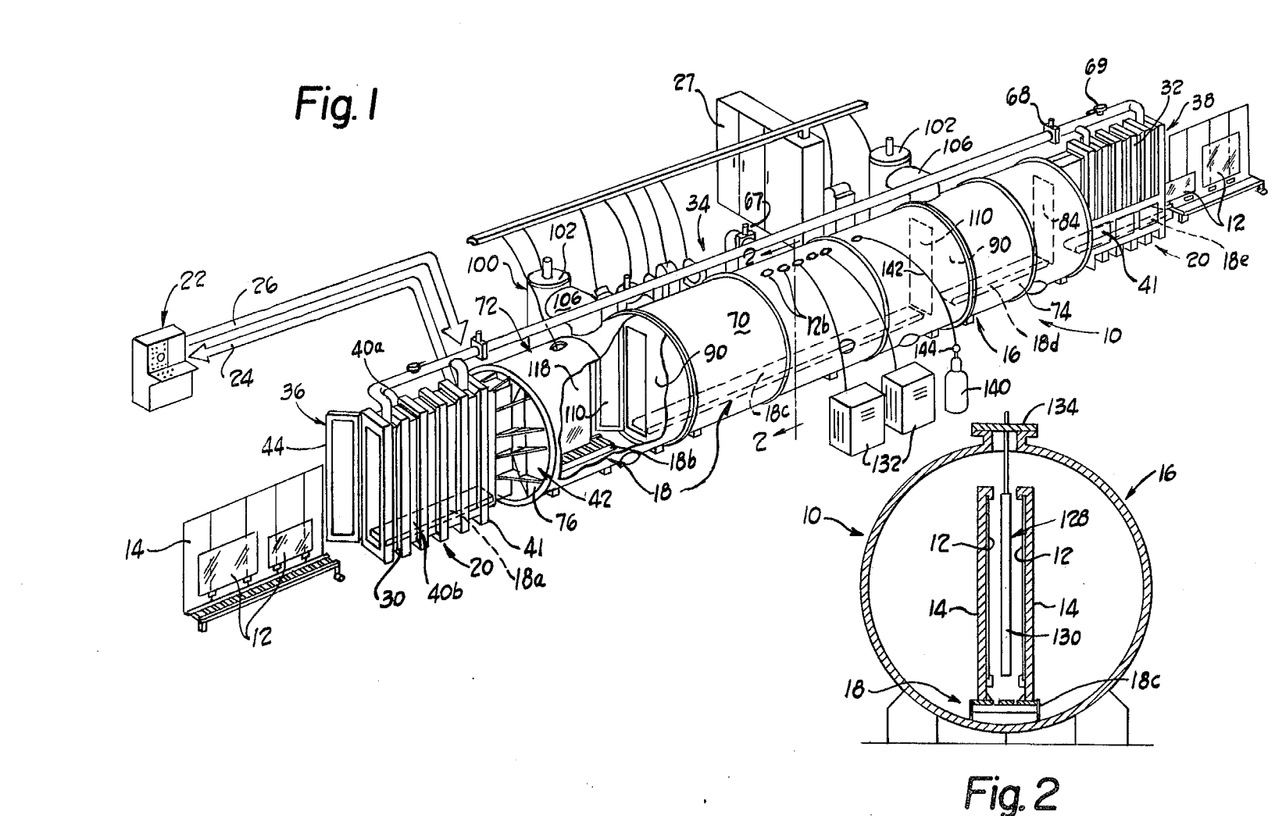
FIG. 1 is a perspective view of a coating facility embodying the invention.
FIG. 2 is a cross-sectional view seen approximately from the plane indicated by the line 2—2 of FIG. 1.

A large scale substrate coating facility 10 constructed according to the present invention is illustrated in part by FIG. 1 of the drawings. Substrates, in the form of architectural glass lights 12, are attached to supporting racks, or frames, 14 and moved through an evacuated working chamber system 16 where the substrates are coated, preferably by cathodic sputtering. The substrate racks 14 are moved by a conveyor system 18 through the working chamber system 16 via an access chamber system 20, which enables substantially continuous and speedy production of coated substrates.

The operations of the working chamber system 16, the access chamber system 20, the conveyor system 18 and associated components are monitored and governed from a control console, indicated by the reference character 22, which has electrical input signals provided to it from various pressure and position responsive transducer elements on input lines schematically indicated by the reference character 24. Output control signals from the control console are transmitted on output lines schematically illustrated by the reference character 26. The console 22 includes suitable process controlling circuitry (not illustrated) which receives input signals from the various systems of the facility and produces appropriate output signals for operating individual components of the system. The console 22 is also preferably equipped with manual overriding devices which enable components of the facility to be operated independently of the process control circuitry if desired.

Electrical power for various components of the facility 10, such as the conveyor system 18, vacuum pumps for the chamber systems, and so forth is provided from a power supply indicated by the reference character 27 via suitable overhead conduits, schematically shown.

THE ACCESS CHAMBER SYSTEM

The access chamber system 20 enables substrates to be introduced into and removed from the facility 10 without requiring the working chamber system to be vented to atmospheric air pressure. Referring to FIGS. 1 and 3–6 the access chamber system 20 comprises entrance and exit chambers 30, 32, respectively, a roughing vacuum pumping unit 34 associated with the chambers, and entrance and exit pressure gates 36, 38 for sealing the chamber interiors from the ambient atmospheric air.

The chambers 30, 32 are each designed to just receive two substrate racks 14 side-by-side (with the glass lights 12 on the racks confronting each other) with minimum clearances between the chamber walls and the racks. The internal chamber volume is thus as small as possible. The chambers 30, 32 are of identical construction and for convenience like parts of the chambers are indicated by corresponding reference characters. The chambers are both formed by rectangular pressure wall plates 40a, 40b, 40c, 40d, which are hermetically joined along adjacent edges to define a narrow vertically oriented chamber volume having a rectangular cross-sectional shape. The chamber is slightly longer than the racks 14 and defines the maximum length of glass light which can be handled by the facility 10 (in the illustrated construction about 12 feet).

The chamber walls are reinforced by I beam assemblies 41 spaced apart along the length of the chamber and girding it. The I beams of each assembly are welded to the adjacent wall plates with the adjacent ends of the I beams mitered and welded together. This construction effectively prevents the chamber walls from collapsing under atmospheric pressure forces when the chamber is evacuated.

The ends of the wall plates 40a–40d adjacent the working chamber system form a transition section 42 between the access chamber and the working chamber system. The wall plates diverge at small angles proceeding toward the working chamber system to form what can be described as a frustum of a rectangular pyramid having its base hermetically welded to the working chamber system. The divergent wall plates have reinforcing webs welded to them for structural support while the interior of the transition section is a rectangular passage of increasing area proceeding toward the working chamber.

Figure 3:
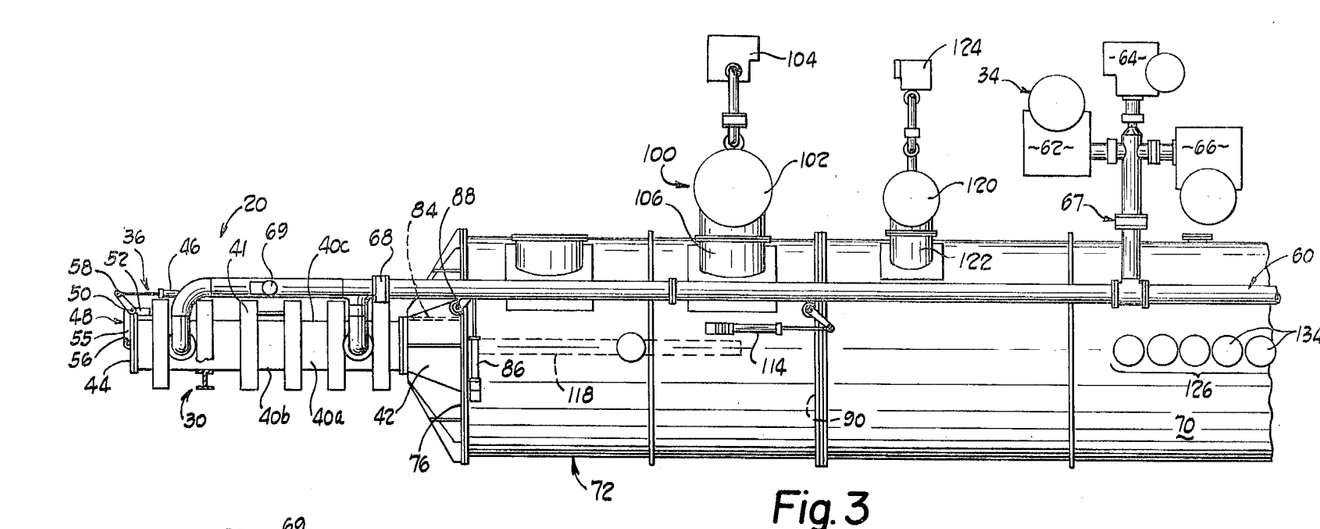
FIG. 3 is a top plan view of part of the facility illustrated by FIG. 1.
Figure 4:
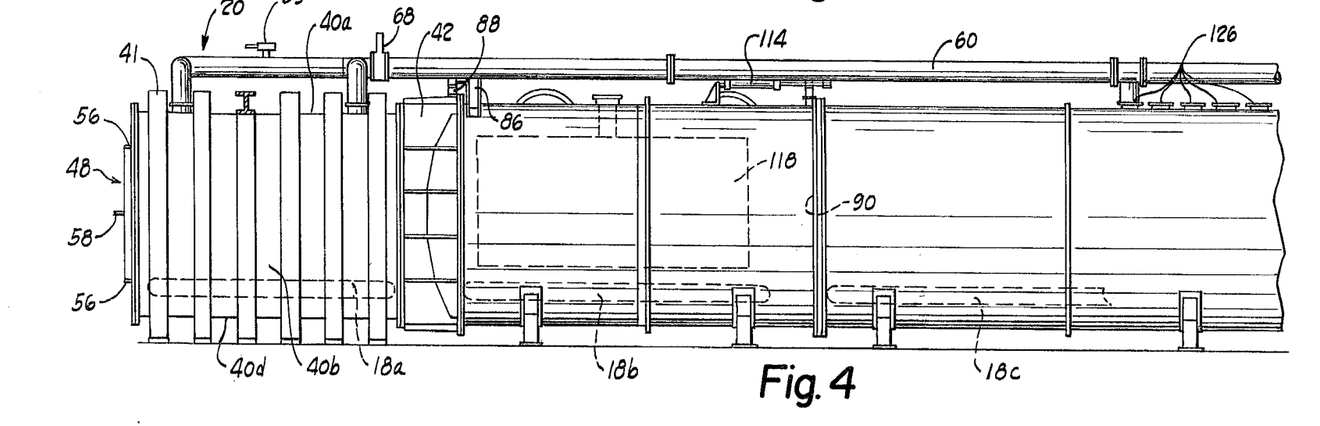
FIG. 4 is an elevational view of the part of the facility illustrated by FIG. 3.
Figure 5:
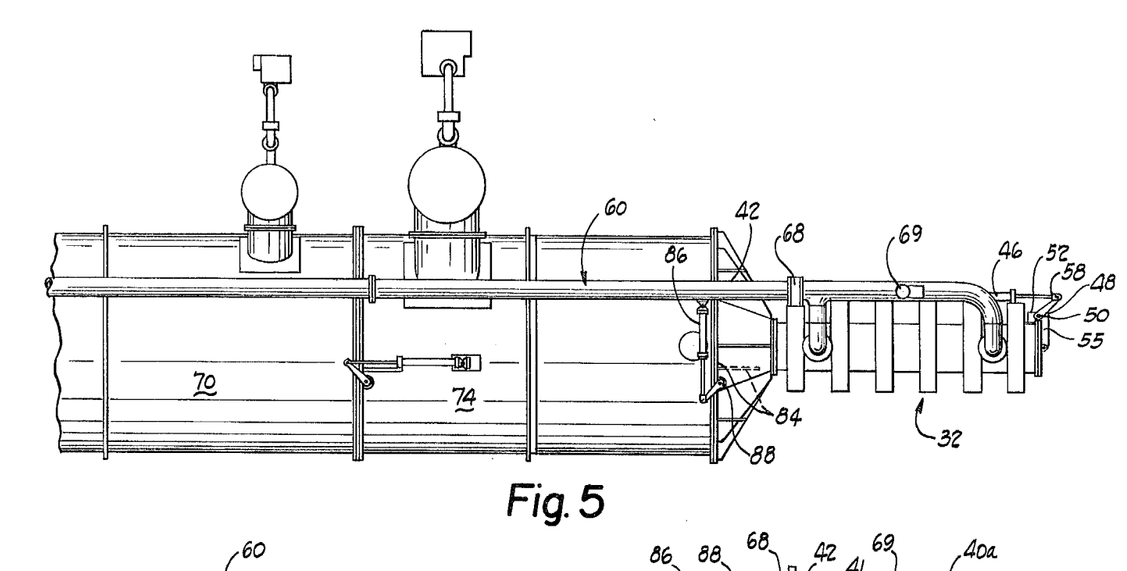
FIG. 5 is a top plan view of part of the facility illustrated by FIG. 1.
Figure 6:
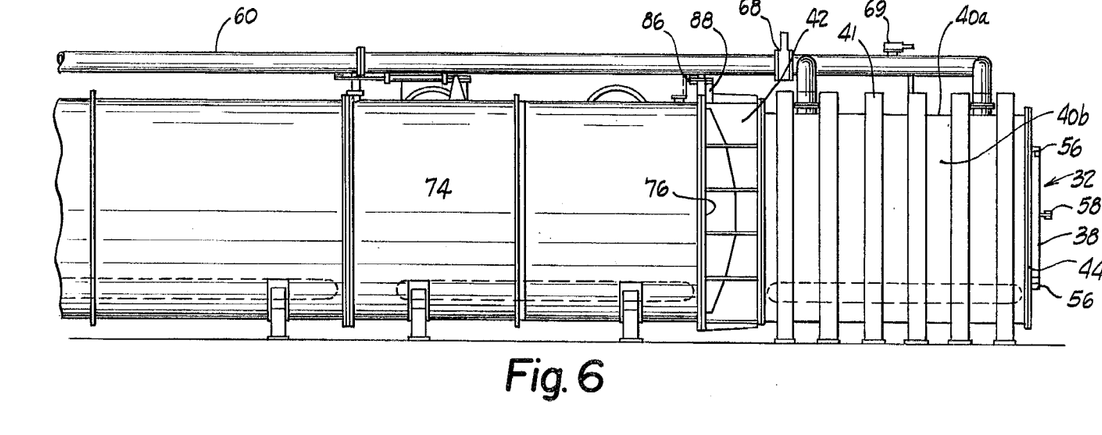
FIG. 6 is an elevational view of the part of the facility illustrated by FIG. 5.

The gates 36, 38 are identical and like components of each are indicated by corresponding reference characters. Each gate is formed by a pressure door 44 hinged to the entrance chamber wall and a door actuator 46 (FIGS. 3 and 4). The door 44 is formed by an imperforate rectangular steel plate connected along one side to the adjacent vertical chamber wall by a hinge 48. The door defines a peripheral sealing section which seats against the end of the chamber when the door is closed. The sealing section is preferably formed by a resilient O-ring type seal which is disposed in a peripheral door groove for engaging the end of the chamber and sealing about the substrate receiving opening.

The door hinge 48 includes a pintle 50 fixed to the chamber wall by a knuckle bracket 52 and supporting a bell crank for rotation about the pintle axis. The bell crank is formed by knuckle body 55 carried on the pintle having vertically spaced arms 56 projecting from it an pivotally connected to the door along its vertical midline. The pivot connection between the crank arms 56 and the door allows the door to squarely seat on the chamber when closed. The knuckle body 55 also has an articulating arm 58 projecting from the door for connection with the actuator 46.

The actuator 46 is preferably a pneumatic ram having its cylinder connected to the entrance chamber and its piston rod connected to the articulating arm 58. Each ram is controlled by a pneumatic valve (not illustrated) which is electrically actuated in response to output signals from the control console 22 to open and close the associated assess chamber gate 36, 38. Operating pressure for the actuator 46 is provided from a suitable air pressure source which is not illustrated.

Each pressure gate 36, 38 is equipped with a position sensitive switch arrangement (not illustrated) for indicating when the doors are open and closed. The pressure switches are wired to the console 22 so that door position signals are available for enabling or preventing process control decisions. The switches can be of any suitable construction and location.

The roughing vacuum pumping unit 34 functions to evacuate the entrance and exit chambers 30, 32 and comprises a pumping manifold 60 for communicating both the chambers to the inlets of roughing vacuum pumps 62, 64, 66 (FIG. 3). The manifold 60 is preferably formed by a pipe carrying a pump isolating valve 67, chamber isolating valves 68 for isolating respective individual access chambers from the remainder of the manifold 60, and vent valves 69 for venting respective ones of the access chambers to atmospheric pressure.

The manifold pipe extends between the entrance and exit chambers along the working chamber system and has branched ends extending into communication with the respective chambers 30, 32. The pump inlets are connected to the manifold 60 via a tee connection and the pump isolating valve 67. The valve 67 can be closed to enable communication between the access chambers without exposure to the roughing vacuum pumps. Each chamber isolating valve 68 is disposed between the respective branched pipe ends and the remainder of the manifold 60 while each vent valve 69 is stationed between the associated isolating valve and the chamber. The use of branched pipe ends maximizes flow area for air pumped from and vented into the respective access chambers. During venting the relatively large flow area provided by the branched pipe ends tends to limit the velocity of the atmospheric air flowing into the chambers. Extreme flow velocities in the confined access chambers might otherwise cause sufficient turbulence to damage the substrates.

The isolating and vent valves are electrically controlled by individual output signals from the control console 22 and can be of any suitable construction. The valves are preferably actuated by air pressure from the same source which operates the pressure gate rams.

The pumps 62, 64, 66 are all electric motor driven reciprocating piston, compressor type pumps which are particularly efficient when pumping gas which is sufficiently dense to exhibit fluid flow characteristics, for example, gas at above absolute pressures of about 500 microns. Operation of the pumps is initiated and terminated in response to output signals from the console 22 via the lines 26. Each pump has its inlet connected directly to the manifold 60.

The preferred pumps are each capable of providing a pumping flow rate of about 850 cubic feet per minute with atmospheric pressure at their inlets. The actual pumping flow rate diminishes as the pumps evacuate one or the other of the chambers 30, 32 and when the gas density is reduced to a level where its flow can be characterized as molecular flow, or molecular in nature, (generally below 500 microns), the pumping speed diminishes quite markedly. This occurs because the pump inlets have relatively small areas and the statistical probabilities of gas molecules entering them become quite small as the number of available molecules is decreased.

The use of roughing vacuum pumps which are highly efficient in pumping gas exhibiting fluid flow characteristics is an important consideration because these pumps are relatively inexpensive and enable evacuation of the relatively small volume chambers 30, 32 from atmospheric pressure to the range of 700–500 microns with great speed.

It should be appreciated that there may be some reciprocating piston vacuum pumps which, because of design geometry, etc., can operate relatively efficiently down to about 300 microns. Other pumps, such as axial flow turbine pumps, could also be employed in place of the pumps 62, 64, 66, but such pumps are extremely expensive particularly in the sizes required to duplicate the capacity and effective pressure range of the illustrated pumps associated with the facility 10. However, the use of these kinds of pumps in a facility constructed according to the present invention is not particularly advantageous because their high degree of performance below 500 microns would not normally be required.

The access chamber system 20 is provided with suitable pressure transducers (not illustrated) which respond respectively to the entrance and exit chamber pressures for enabling control of operation of the facility 10 from the control console 22. The pressure transducers produce output signals when the respective access chambers are at atmospheric pressure and at a desired roughing vacuum level (e.g. 700 microns). The transducer output signals are fed to the control console 22 via the line 24 for use in controlling operation of the roughing vacuum pumps, the various isolation valves, the conveyor system and pressure gates associated with the access chambers.

THE WORKING CHAMBER SYSTEM

The working chamber system comprises a central coating chamber section 70 and isolation chamber sections 72, 74 each interposed between an end of the coating chamber and a respective access chamber. Substrates are conveyed successively through the isolation chamber 72, the coating chamber 70 and the isolation chamber 74 during the coating operation. The coating and isolation chambers are formed by a succession of flanged cylindrical pressure wall sections hermetically welded together at their end flanges. Opposite ends of the working chamber system are each formed by a circular end plate 76 hermetically welded about its periphery to the adjacent pressure wall section. Substrate racks move between the access chamber system and the isolation chambers via rectangular openings formed in the end plates 76 which conform to and are aligned with the adjacent access chamber. The ends of the access chamber transition sections 42 are welded to the end plates 67, about the opening and the transition wall reinforcing webs are also welded to the end plates.

Pressure gates open and close communication between each isolation chamber and the respective associated access chamber. The pressure gates are of identical construction and like components are indicated by corresponding reference characters. Each gate includes a pressure door 84 hinged to the end plate 76 for opening into the transition section 42 (illustrated by broken lines in FIGS. 3 and 5) and a door actuator 86. Operation of the actuator 86 to open and close the pressure door is governed by output signals from the console 22 via the line 26.

The pressure door 84 and its hinge are constructed generally like the pressure door 44 and the hinge 48 and therefore are not described in detail except where the constructions are slightly different. The actuator 86 is supported atop the isolation chamber pressure wall and is formed by a pneumatic ram, like the actuator 46. The ram operates the door 84 via a shaft 88 extending downwardly on the door hinge axis from the actuator through a seal assembly mounted on the transition section wall. The shaft 88 forms the hinge pintle and is drivingly connected to the pressure door. The reception of the open pressure door 84 in the transition section 42 assures adequate clearance for the racks to pass the door, as noted, while minimizing the volume of the access chamber and the transition section to assure quick pumping of the access chamber system.

The access-isolation chamber gates are equipped with position sensitive switch arrangements for indicating when the gate are fully opened and closed. The switches (not shown) are connected to the console 22 via the lines 26 to produce signals for enabling or preventing movement of substrates in the facility, pump operation, and so forth. The switches can be of any suitable construction and positioned, for example, adjacent movable parts of the door actuator 86.

THE CONVEYOR SYSTEM

The substrate racks 14 are moved into and through the facility 10 by the conveyor system 18 which is schematically illustrated and can be of any suitable construction. In the preferred embodiment of the invention the conveyor system is formed by independently operating aligned conveyor sections 18a–18e, each conveyor section disposed within a respective chamber. Each conveyor section is formed by a series of rack supporting rolls mounted for rotation in a frame extending along the bottom of the associated chamber. A variable speed reversible electric motor (not illustrated) drives rolls of each conveyor section by way of a drive shaft extending to the conveyor section through a seal supported in the chamber wall and drive transmitting chains extending between the shaft and driven conveyor rolls. The electric motors are individually controlled by output signals from the console 22 via the lines 26, with operating power being supplied from the power supply 27.

Adjacent ends of the conveyor sections are spaced apart to permit clearance for opening the pressure doors between the chambers. The racks 14 are sufficiently long and rigid to enable them to bridge the spaces between the conveyor sections moving from one chamber to another.

Each conveyor section is provided with position responsive transducers, preferably electric switch assemblies (not illustrated), which detect the presence and absence of substrate racks at predetermined locations along the conveyor section. The switch assemblies are electrically connected to the control console 22 via the lines 24 for enabling control of appropriate conveyor motors, pumps, etc., in accordance with signals provided by the position switches.

THE ISOLATION CHAMBERS

The isolation chambers function to: Enable substrate supporting racks to be admitted to and removed from the working chamber system while substrates on other racks are being coated; increase the effective pumping speed and efficiency of the facility 10 without requiring use of extremely expensive pumps; and, enhance the quality of coated substrates by effectively purging the coating chamber atmosphere of possible contaminants. In addition the isolation chamber from which substrates are introduced to the coating chamber is effective to reduce the amount of contaminants which could otherwise be introduced to the coating chamber with the substrates and racks to be coated. The isolation chambers are of identical construction and therefore only the isolation chamber 72 between the entrance chamber and the coating chamber is described in detail.

The isolation chamber 72 is defined by a pair of joined cylindrical pressure wall sections, closed at one end by the plate 76 and at the other end by a bulkhead 90 and an associated vacuum pumping system. A pressure gate 92 (see FIG. 1) associated with the bulkhead 90 enables substrate supporting racks 14 to move through the bulkhead 90 between the isolation chamber and the coating chamber as well as to communicate the chamber atmospheres. Substrate racks are moved through the isolation chamber 72 on the conveyor section 18b which is aligned with the conveyor section 18a in the entrance chamber.

The isolation and entrance chambers are constructed and arranged so that, when racks are to be transferred to the isolation chamber from the entrance chamber the vacuum pumps associated with the chambers need not be operated in the transition pressure range between fluid and molecular flow. The isolation chamber volume is large compared to the access chamber volume, with the cylindrical pressure wall having about a 10 foot diameter and a length of about 16 feet. The volume ratio of the access chamber to that of the isolation chamber is, in the preferred embodiment of the invention, approximately 1:4. When the isolation chamber is at a lower pressure than the entrance chamber and the pressure door 84 is opened, the atmosphere in the access chamber expands into the isolation chamber and pressure equalization occurs with the final pressure being relatively near the original isolation chamber pressure than the original access chamber pressure.

A molecular flow vacuum pumping system 100 (FIGS. 1 and 3) is associated with the isolation chamber for quickly evacuating the isolation chamber to extremely low pressures, i.e., absolute pressures of between 0.01 and 0.001 microns. In the preferred and illustrated embodiment the pumping system 100 includes a suitable or conventional oil diffusion pump 102 and the usual associated mechanical pumps 104 for pumping the discharge gas from the diffusion pump. Th preferred oil diffusion pump 102 is rated as a 35 or 36 inch pump in that the pump intake has a 35 or 36 inch diameter. The ability of a molecular flow pump to remove gas from an evacuated space is directly related to the area of the pump intake and accordingly the large intake opening of the pump 102 enables relatively fast and effective pumping of gas molecules from the isolation chamber. The isolation chamber wall has pump intake ducting structure 106 formed integrally with it and the pump system 100 is attached to a suitable mounting flange on the ducting structure 106.

Operation of the pumping section 100 is initiated and terminated by control signals from the console 22 via the lines 26 while power for operating the pumping system is provided from the power supply 27.

The pressure gate 92 is formed by a pressure door 110 connected to the bulkhead 90 by a hinge structure and driven between its open and closed position by an actuator 114 (FIG. 3) attached to the exterior of the working chamber. The actuator 114 is operated in response to control signals provided from the console 22 via the lines 26. The pressure door, hinge and actuator are constructed substantially the same as the previously described pressure gates between the access and isolation chambers.

The isolation chamber 74 is essentially a mirror image of the isolation chamber 72 and all of the chamber components are identical to those of the chamber 72 except where otherwise indicated. Accordingly the construction of the components of the chamber 74 are not described in detail and are indicated by the same reference characters used in conjunction with identical components of the chamber 72.

Both isolation chambers are provided with suitable pressure transducers (not illustrated) for producing electrical output signals which are fed to and monitored by the control console 22 so that movement of substrates to and from the isolation chambers, operation of the pumping systems, etc. is enabled or prevented in response to sensed chamber pressures. Similarly, the pressure gates 92 are equipped with door position sensing switch arrangements connected to the console 22 for indicating whether the doors are open or closed so that movement of substrates and operation of pumps can be governed accordingly.

The isolation chamber 72 differs from the isolation chamber 74 in that a heater 118 is disposed in the chamber 72 between the paths of travel of the substrates for further facilitating conditioning of the substrates for coating. The heater 118 heats the substrates and racks to aid in driving moisture retained on them into the isolation chamber atmosphere by evaporation. It should be noted that a considerable amount of moisture can be retained by the substrates and racks through the period of the access chamber evacuation and heating the substrates and racks in the isolation chamber 72 provides an important supplemental conditioning effect. The heater 118 is preferably a radiant heater producing radiation whose frequency is tuned for absorption by the substrates and racks. A glow discharge type heater could alternatively be employed if desired. The heater 118 is suspended in the chamber 72 from a top access port and electrically connected to the power supply 27.

THE COATING CHAMBER

The coating chamber 70 is defined within the cylindrical pressure walls between the bulkheads 90 and, in the illustrated embodiment of the invention, is equipped to coat substrates moving through it utilizing D.C. sputtering techniques at deep vacuum pressures in an inert, or at least chemically controlled, atmosphere. The preferred coating chamber is at least slightly greater than twice the length of the substrate racks 14 to enable the racks and substrates to be stationed entirely within the coating chamber with the gates 92 closed before and after coating takes place. In other words, the coating chamber is of sufficient length that substrate coating takes place when both of the gates 92 are closed.

The coating chamber is evacuated by a molecular flow vacuum pumping system formed by a pair of molecular flow vacuum pumps 120 which are operated together to maintain an absolute coating chamber pressure level in the range of 2-50 microns during the coating process. Each illustrated pump 120 is a 20 inch oil diffusion pump mounted to an intake duct 122 and provided with a mechanical exhaust pump unit 124. The intake ducts are located adjacent opposite ends of the coating chamber so that the gas molecules tend to drift generally away from the central part of the coating chamber where the coating process takes place. Operation of the pumps 120 is controlled by output signals from the console 22 via the lines 26.

In the preferred facility 10 the central section of the coating chamber is provided with a series of spaced access ports 126 arrayed along the top of the chamber and aligned in the plane of the central axis of the chamber. Each port 126 is surrounded by a mounting flange to which a sputtering electrode assembly 128 can be mounted and sealed in place (See FIG. 2). The ports 126 are positioned so that a sputtering electrode of each electrode assembly extends downwardly within the coating chamber and between the substrate supporting racks. In the illustrated embodiment of the invention two electrode assemblies are mounted and sealed in place in separate ones of the ports 126, the remaining ports being sealed closed by suitable covers removably attached to the respective port flanges. Each electrode assembly includes a single depending cathode electrode 130 (See FIG. 2) capable of simultaneously sputtering material onto substrates as they move past on opposite sides of the electrode.

Each electrode 130 is electrically connected to a respective D.C. power supply which can be of any suitable construction and is illustrated as enclosed within a housing 132 (FIG. 2). Coolant, preferably water, is fed to the assembly via dielectric tubes. The power and coolant are provided to the electrode 130 via an electrode supporting plate 134 sealed in place across a respective chamber port.

The electrode assemblies referred to are preferably identical to enable substrates to be coated from one electrode and then, when its supply of sputtering material is exhausted, from the other electrode. Providing multiple identical electrodes lengthens the time between electrode assembly replacement. Electrode replacement requires venting the facility to atmosphere which is undesirable because of the lost production time. The illustrated coating chamber has five access ports, each capable of receiving an electrode assembly.

As indicated previously the sputtering takes place in a controlled atmoshere. As illustrated by FIG. 1 a source 140 of Argon gas in the form of a tank, or tanks, of compressed Argon is communicated to the working chamber via a supply line 142 and control valve 144. The gas is admitted to the coating chamber through vertically spaced nozzles supported in the control part of the coating chamber in alignment with the electrodes. The nozzles direct the Argon toward the electrodes between the substrate racks so that a supply of ionizing gas adjacent the electrodes is assured. The flow rate of Argon into the coating chamber is restricted by the control valve 144 and the nozzles and is adjusted so that the coating chamber pressure is readily maintainable between 2 and 50 microns with the pumps 120 operating during the coating process.

The preferred sputtering electrode assembly and associated equipment is described in greater detail in the cross referenced application of Chambers and Wan, the disclosure of which is incorporated herein in its entirety by this reference to it. The operation of this equipment is governed by control signals produced by the console 22 via the lines 26.

The coating chamber is provided with a pressure transducer (not shown) for transmitting pressure level indicative signals to the console 22. The console 22 monitors the coating chamber pressure to enable the chamber atmosphere pressure to be stabilized at the desired coating pressure level.

OPERATION

The facility 10 is prepared for operation by installing appropriate electrode assemblies in the coating chamber, connecting them to their power and coolant supplies, connecting the Argon source to the chamber and evacuating the working and isolation chambers down to their operating pressures. Because diffusion pumps are ineffective for evacuating a chamber having an internal pressure greater than about 200 microns, the facility 10 must be pumped down to the diffusion pump operating pressure range by the roughing vacuum pumping system. Accordingly, the gates 36, 38 are closed, the remaining internal pressure gates are opened, the isolating valves 67, 68 are opened and the roughing vacuum pumps are operated to evacuate the working chamber system.

The chambers are evacuated to about a 500 micron pressure level fairly quickly; but the roughing vacuum pumps rapidly lose efficiency when the intake gas loses its fluid flow characteristics and begins to exhibit molecular flow characteristics. This transition begins at chamber pressures around 500 microns. Nevertheless the roughing vacuum pumps continue to operate until the chamber pressure is reduced to 150-200 microns. This requires considerable time because of the relatively small roughing vacuum pump inlet openings, as noted previously.

When the chamber system pressure is reduced sufficiently to enable diffusion pump operation the doors 84 are closed to isolate the access chambers from the working chamber system and all of the diffusion pumps are energized. At the same time the isolation valves 67 and 68 are closed to isolate the entrance and exit chambers from each other and from the roughing vacuum pumping system. The diffusion pumps reduce the system pressure to just a few microns relatively quickly.

The pumping speed of the diffusion pumps is affected to some extent by how "dirty" the working chamber system is inside. Whenever the working chamber system is opened and exposed to atmospheric air, contaminants are introduced to the chambers. For example, it is inevitable that water vapor and molecules of gases from the air are trapped by the chamber walls. Organic substances can likewise be introduced in any one of a number of ways. If the working chamber system is relatively "dirty" the time required to reduce the pressure is lengthened because of the numbers of contaminant molecules which must be "degassed" from the chamber. When the working chamber system contaminants have been substantially degassed, the working chamber pressure falls into the range of 0.01 to 0.001 microns, primarily under control of the diffusion pumps 102.

The amount of time taken to evacuate the facility varies, as noted, but the reduction of pressure through the roughing vacuum range (to about 200 microns) usually requires about 45 minutes. If the chambers are clean (for example, if the facility 10 has only been opened to atmosphere to change electrode assemblies) the pumping can be completed in about one hour. If the facility has been fully opened to atmosphere with work of one kind or another conducted in the chambers the pumping time can be extended materially.

After the initial pump-down is completed the coating chamber atmosphere and operating pressure level are established. To accomplish this the gates 92 are closed to isolate the coating chamber and the Argon source control valve 144 is opened to introduce Argon into the coating chamber. The coating chamber is provided with a sufficient Argon flow to establish an atmosphere having a pressure of between 25 and 50 microns with both diffusion pumps 120 operating. This pressure is maintained by operating the diffusion pumps continuously while Argon is being supplied.

In accordance with an important feature of the invention the facility 10 is so constructed and arranged that, after the initial pump down, the system is operated without requiring either the roughing vacuum pumps or the system diffusion pumps to be operated in the flow transition region between 500 and 200 microns. The preferred system is constructed and operated so that the roughing vacuum pumps operate down to between 700 and 500 microns and the diffusion pumps operate primarily below about 150 microns. This optimizes pumping efficiencies, minimizes the time required for moving substrates through the facility, and obviates the need for additional, highly expensive vacuum pumps capable of operating in the flow transition region.

Substrates to be coated are introduced by opening the entrance chamber vent valve 69 and, when the entrance chamber 30 is vented to atmopsheric pressure, opening the pressure door 44 for reception of substrate supporting racks. A pair of the substrate supporting racks 14 is guided onto the entrance chamber conveyor section 18a and advanced until the racks actuate the position responsive switches indicating that the racks are completely within the entrance chamber. The switch actuation results in stopping the conveyor section 18a and closing the pressure door 44.

The access chamber is then reevacuated. Upon closure of the door 44 the pump isolating valve 67 is closed and the isolation valves 68 are opened to communicate the entrance and exit chambers. Since the exit chamber 32 had remained at a pressure of about 200 microns, the entrance chamber atmosphere expands into the exit chamber reducing the total access chamber system pressure to about one half atmospheric pressure. The isolation valve 67 is then opened, the exit chamber isolation valve 68 is closed and the roughing vacuum pumping system is operated to continue evacuation of the entrance chamber. The entrance chamber is pumped until its internal pressure is between 700 and 500 microns, absolute pressure, at which time the entrance chamber pressure transducer produces an output signal effective to reclose the entrance chamber isolation valve 68. Evacuating the entrance chamber to 700–500 microns occurs quite quickly both because the reciprocating piston roughing pumps are operated efficiently in the fluid flow pressure range and because the entrance chamber configuration minimizes the pumping volume. In the preferred system pumping the entrance chamber is pumped to the roughing vacuum level from about one half atmosphere in approximately 80 seconds.

At this juncture the entrance chamber isolation valve 68 is reclosed and the exit chamber isolation valve 68 is opened. The roughing vacuum pumps continue to operate until the exit chamber has been pumped down to the roughing vacuum level again.

After the entrance chamber isolating valve 68 is closed the pressure door 84 between the entrance and isolation chambers is opened. The isolation chamber is substantially larger than the access chamber so that the gas in the access chamber expands into the isolation chamber. The resultant pressure in the chambers is substantially lower than the access chamber roughing vacuum level and well within the effective pumping pressure range of the isolation chamber diffusion pump, i.e., approximately 150 microns. The preferred isolation chamber is configured with a volume at least 3.5 times the volume of the access chamber to insure optimum expansion of the access chamber atmosphere.

When the pressure door 84 is opened the conveyor sections 18a, 18b in the entrance and entrance isolation chambers are operated to advance the substrate supporting racks into the isolation chamber 72. The rack advancement is terminated when the racks encounter the limit switches in the isolation chamber. Operation of the switches enables deactivation of the conveyor sections 18a, 18b, closure of the pressure door 84.

The diffusion pump 102 quickly reduces the pressure in the isolation chamber to 0.01 microns or less which results in the racks and substrates being subject to degassing of contaminants throughout the period of their residence in the isolation chamber. The pump 102 can usually reduce the isolation chamber pressure to less than 0.01 microns in about 10 seconds although a somewhat longer period is required if the racks and/or substrates are abnormally "dirty." No specific chemical atmosphere need be established or maintained in the isolation chamber preparatory to the substrates being advanced from it. In the preferred facility the diffusion pump 102 and heater 188 operate continuously.

When the isolation chamber pressure has been reduced appropriately the pressure transducer signal to the console 22 is such that the actuator for the coating chamber pressure door is enabled to operate. If the coating chamber is ready to receive the substrates the pressure door 110 opens to enable the substrate racks to move into the coating chamber.

Meanwhile, the entrance chamber 30 has been vented, a succeeding pair of substrate racks advanced into it and the chamber reevacuated in the manner set forth previously.

The isolation chamber 72 functions to purge the coating chamber as the substrate racks are advanced for coating. As noted, the coating chamber is provided with an Argon atmosphere maintained at an absolute pressure between 25 and 50 microns. When the door 110 is opened the coating chamber is fully communicated with the isolation chamber 72 whose pressure is no more than about 0.01 microns. The atmosphere in the coating chamber is, in effect, cleansed, or purged because the coating chamber atmosphere tends to expand into the isolation chamber when the pressure door between them is opened. The effect of this is that the coating chamber atmosphere, including any impurities, is partially drawn from the coating chamber and the possibility of contaminant molecules entering the coating chamber from the isolation chamber is minimized.

The conveyor sections 18b, 18c are enabled to advance the substrate racks from the isolation chamber to the coating chamber in response to the door 110 opening. When the substrate racks have fully entered the coating chamber, position sensing switches are actuated by them to terminate operation of the conveyor sections and enable the pressure door 110 to reclose. It should be appreciated that, because of purging the coating chamber atmosphere while introducing the substrate and racks, virtually the only sources of contaminants in the coating chamber are the substrates and racks themselves. Because the substrates and racks have been conditioned by degassing in the isolation chamber 72 at lower than coating chamber pressures, the tendency for the racks and substrates to degas further in the coating chamber is reduced. Therefore the coating chamber atmosphere tends to remain quite free from contamination.

After closure of the coating chamber pressure door, the Argon admitted to the coating chamber increases the coating chamber pressure until the coating chamber pressure is between 25 and 50 microns. The sputtering electrode is then energized from its power supply and the conveyor section 18c is again operated to move the substrate racks past the electrode at a controlled speed. Electrode material is sputtered onto the substrates as they pass the electrode. After the racks have passed the electrode they encounter position sensing switches which terminate operation of the coating chamber conveyor section and deenergize the electrode so that the racks and substrates are stopped beyond the sputtering electrodes in position for removal from the coating chamber.

The coating chamber conveyor section 18c can be reversed so that the substrates can be reconveyed past the sputtering electrodes if desired to provide additional coating material.

When the substrates and racks are removed from the coating chamber the coating chamber atmosphere is purged by the exit isolation chamber 74 which, like the isolation chamber 72, is normally maintained below 0.01 microns. The pressure door 110 between the isolation chamber 74 and the coating chamber is opened causing the atmosphere in the coating chamber to expand into the isolation chamber 74, tending to sweep the atmosphere from the coating chamber. The coated substrates are then advanced into the isolation chamber 74 and the pressure door 110 reclosed to cut off communication between the coating and isolation chambers.

The exit chamber 32 is then communicated with the isolation chamber 74 by opening the pressure door 84 between them causing the exit chamber atmosphere (maintained at a roughing vacuum level) to expand into the isolation chamber. The pressure in the exit and isolation chambers equalizes at a level within the operating range of the diffusion pump 102. The substrate racks are then moved into the exit chamber and the pressure door 84 is reclosed to enable the isolation chamber 74 to be pumped down again to between 0.01 and 0.001 microns. This effectively removes contaminants introduced to the isolation chamber 74 from the exit chamber.

Assuming the entrance chamber 30 contains additional racks of uncoated glass at atmospheric pressure, the isolation valves 68 are opened to allow the entrance chamber atmosphere to expand into the exit chamber. The exit chamber isolation valve is reclosed and the exit chamber vent valve 69 is opened to permit the exit chamber to return to atmospheric pressure. The racks and coated substrates are then advanced from the exit chamber and the vent valve 69 is reclosed. The exit chamber isolating valve 68 is reopened and the exit chamber is again ready to be evacuated to the roughing vacuum level.

If desired, the exit chamber 32 can also be partially evacuated by communicating it to the entrance chamber 30 after the additional racks in the entrance chamber have been advanced to the isolation chamber 72. This is accomplished by communicating the entrance and exit chambers via the isolating valves 68 in the manner noted previously.

The coating process is substantially continuous in that as soon as a pair of racks and substrates are received by the isolation chamber 72 preparatory to coating, the entrance chamber 30 is vented to asmosphere reopened, and receives a second pair of substrate racks. The entrance chamber isolation valve 68 is reopened and the roughing vacuum pumping system 20 is operated to reduce the pressure of the entrance chamber to around 700 microns. Movement of the second pair of substrate racks into the isolation chamber 72 can be accomplished as soon as the preceding substrate racks have been moved into the coating chamber.

Generally speaking, the time taken to coat substrates on one pair of substrate racks in the coating chamber 70 is less than the time required to evacuate the access chambers. The coated substrates are thus held in the coating chamber until the next succeeding pair of substrate racks is disposed in the isolation chamber 72 and conditioned for admittance to the coating chamber. This enables both isolation chambers 72, 74 to be communicated to the coating chamber simultaneously, if desired, so that the coating chamber atmosphere is purged from both ends of the coating chamber as the substrate rack pairs are received by and delivered from the coating chamber.

As noted above the sequence of operation of the chambers can be controlled so that the exit and entrance chambers are communicated to partially evacuate one by the other. If this proceedure can not be followed for one reason or another the time required to pump either chamber from atmospheric pressure to the roughing vacuum level is increased by approximately 10 seconds.

The facility 10 is operated continuously until the sputtering material from all electrodes stationed in the coating chamber has been consumed. The operation continues without requiring the operation of the diffusion pumps outside of their operating pressure ranges and without requiring the roughing vacuum pumps to reduce the entrance and exit chamber pressures to less than about 700 microns, except when the system is initially pumped down.

While a single embodiment of the present invention has been illustrated and described in considerable detail, the present invention is not to be considered limited to the precise construction shown. Various adaptations, modifications and uses of the invention will occur to those skilled in the art to which the invention relates and the intention is to cover all such adaptations, modifications and uses coming within the spirit or scope of the appended claims.

What is claimed is:

1. A system for sputtering material on substrates at extremely low pressures comprising:
   (a) a working chamber comprising a coating chamber section and an isolation chamber section defined by a generally cylindrical pressure wall;
   (b) an access chamber adjacent said isolation chamber section;
   (c) structure defining pressure gates between said chamber sections and between said access chamber and ambient atmosphere;
   (d) roughing vacuum pumping means for evacuating said access chamber to a first, roughing vacuum pressure;
   (e) first and second molecular pumping means for evacuating said isolation and coating chamber sections, respectively, said first molecular pumping means effective to evacuate said isolation chamber from a second pressure level substantially less than said roughing vacuum pressure;
   (f) a source of gas communicating with said coating chamber section for providing a controlled atmosphere in said coating chamber section; and,
   (g) a conveyor system for supporting and moving substrates through said chambers via said gates;
   (h) said access chamber formed by pressure wall structure extending closely about substrates conveyed therethrough to minimize the volume of said access chamber and said isolation chamber section defining an internal volume which is no less than about three times larger than said access chamber volume so that when said access and isolation chambers are communicated said isolation chamber effectively further evacuates the access chamber and reduces the pressure in said access chamber substantially to assure said second pressure level in said isolation chamber when said access and isolation chambers are communicated.

2. The system claimed in claim 1 wherein said roughing vacuum pumping means comprises a reciprocating piston vacuum pump and said first and second molecular pumping means comprise diffusion pumps, said first diffusion pump effective to maintain said isolation chamber pressure below the pressure in said coating chamber section.

3. The system claimed in claim 1 wherein substrates are supported on substrate support racks movable through said chambers by the conveyor system, said coating chamber section being greater than twice the length of said substrate supporting racks to enable coating of substrates with the gate between the isolation and coating chambers closed.

4. The system claimed in claim 1 wherein said working chamber further includes a second isolation chamber section, said system further including an exit chamber adjacent said second isolation chamber section with said conveyor system constructed to move substrates from said coating chamber section to said exit chamber via said second isolation chamber section and a manifold for communicating the roughing vacuum pumping means with said access and exit chambers, and manifold including valve means for isolating said access and exit chambers individually from said manifold.

5. The system claimed in claim 4 wherein said access and exit chambers are of generally rectangular cross-sectional shape and said isolation and coating chamber sections are substantially cylindrical.

6. The system claimed in claim 5 wherein the ratio of the volume of one of said isolation chamber sections to the volume of one of said access or exit chambers is no less than about 3.5 to 1.

7. The system claimed in claim 4 wherein each of said access and exit chambers is associated with a vent valve enabling venting of the respective chambers to atmosphere.

8. The system claimed in claim 4 further including a roughing vacuum pumping means isolating valve for blocking communication between said roughing vacuum pumping means and said manifold.

9. A high rate production vacuum deposition facility for large size substrates comprising:
(a) a relatively large volume working chamber system having an isolation chamber section and a deposition chamber section in which material is deposited on substrates comprising:
  (i) a substantially cylindrical pressure wall;
  (ii) at least one end wall structure defining an elongated substrate opening therein;
  (iii) pressure gate means comprising a door member movable relative to said opening between an open position wherein substrates can pass through said opening and a closed position wherein said opening is sealed closed;
(b) a relatively small volume access chamber system extending from said working chamber system end wall, said access chamber system comprising:
  (i) pressure wall structure defining an access chamber having a generally rectangular elongated cross-sectional shape aligned with said opening, said access chamber pressure wall extending away from said working chamber end wall;
  (ii) an opening defined by said access chamber remote from said working chamber end wall through which substrates can move between said access chamber and ambient atmosphere; and,
  (iii) second pressure gate means for isolating said access chamber volume from the ambient atmosphere comprising a second door member movable between an open position wherein substrates can move through said access chamber opening and a closed position wherein said opening is sealed closed;
(c) roughing vacuum pumping means communicating with said access chamber for reducing the pressure in said access chamber volume below ambient atmospheric pressure, said roughing vacuum pumping means efficiently operable through a range of pressures from ambient atmospheric pressure to a first predetermined subatmospheric pressure at which the atmosphere in said access chamber begins to lose the characteristics of fluid flow; and,
(d) working vacuum pumping means communicating with said working chamber for evacuating said working chamber volume, said working vacuum pumping means operable efficiently to evacuate the working chamber from a second predetermined subatmospheric pressure, which is substantially lower than said first predetermined subatmospheric pressure, at least to an optimum working pressure at which the atmosphere exhibits molecular flow characteristics, said working vacuum pumping means being ineffective at said first predetermined subatmospheric pressure;
(e) said isolation chamber section disposed between said access chamber and said deposition chamber section with the volume of said isolation chamber section being sufficiently larger than the volume of said access chamber that when said access chamber and said isolation chamber section are communicated by said first pressure gate means with said access chamber at said first predetermined subatmospheric pressure and said isolation chamber section approximately at said working pressure, the resultant pressure within said chambers is at or below said second predetermined subatmospheric pressure and within the efficient operating range of said working vacuum pump means.

10. A method of depositing material on substrates comprising:
(a) moving a substrate into a relatively small volume first chamber and mechanically evacuating said first chamber to a first predetermined roughing vacuum pressure level;
(b) communicating said first chamber with a second chamber at a second vacuum pressure level substantially lower than the first vacuum pressure level, the second chamber having a volume no less than about three times the volume of said first chamber,
(c) expanding the atmosphere in said first chamber to a total of no less than about four times the first chamber volume while communicating said chambers to thereby produce an intermediate vacuum pressure level in said first and second chambers which is substantially less than the first predetermined vacuum pressure level, the atmosphere in said second chamber exhibiting molecular flow characteristics at said intermediate pressure level;
(d) advancing the substrate into said second chamber;
(e) isolating said first and second chambers;

(f) evacuating said second chamber by molecular pumping to said second vacuum pressure level to condition the substrate for coating;

(g) providing a deposition chamber and maintaining the pressure in said deposition chamber equal to or greater than said second vacuum pressure level;

(h) communicating said second chamber with said deposition chamber; and (i) advancing the substrate into said deposition chamber and depositing material on said substrate.

11. The method claimed in claim 10 wherein evacuating said first chamber to a predetermined vacuum pressure level includes pumping atmosphere from said first chamber until the density of the remaining atmosphere is sufficiently low that the flow of atmosphere to the vacuum pump inlet begins to exhibit the characteristics of molecular flow.

12. The method claimed in claim 11 wherein the roughing vacuum pressure in the first chamber is no less than about 500 microns and communicating said first and second chambers reduces the density of the atmosphere in the first and second chambers to no more than about 200 microns.

13. The method claimed in claim 10 wherein the deposition chamber is maintained at a vacuum pressure level which is greater than said second vacuum pressure level when said deposition and second chambers do not communicate and communicating said second chamber with said deposition chamber includes purging the deposition chamber atmosphere.

14. The method claimed in claim 10 further including isolating said deposition chamber from said second chamber after advancing the substrate into the deposition chamber and before depositing material on said substrate.

15. The method claimed in claim 14 further including establishing a chemically controlled atmosphere in said deposition chamber at a vacuum pressure level greater than said second vacuum pressure level after isolating said deposition chamber from said second chamber.

16. The method claimed in claim 10 wherein said first vacuum pressure level is between about 700 and 500 microns and said intermediate vacuum pressure level is between 150 and 200 microns.

17. A method of depositing material on large area substrates comprising:

(a) providing a deposition chamber, an isolation chamber and an access chamber which are all isolatable from each other by pressure gates, the isolation chamber defining a substantially larger internal volume than said access chamber;

(b) maintaining said deposition chamber at a predetermined deposition pressure at which the atmosphere exhibits molecular flow characteristics;

(c) maintaining said isolation chamber at a first pressure level equal to or less than said deposition pressure;

(d) conveying a substrate into said access chamber and isolating said access chamber from said isolation chamber and ambient atmosphere;

(e) mechanically evacuating said access chamber to a second pressure substantially greater than said deposition pressure and at which the flow of atmosphere from said access chamber begins to lose the characteristics of fluid flow;

(f) communicating said access and isolation chambers to expand the access chamber atmosphere into the isolation chamber, the volume of the isolation chamber being sufficiently large to create an atmosphere in the communicated chambers having a pressure which is substantially less than said second pressure and which flows in accordance with principles of molecular flow;

(g) conveying said substrate into said isolation chamber and isolating said isolation chamber from said coating and access chambers;

(h) evacuating said isolation chamber at least to said deposition pressure level by molecular pumping;

(i) communicating said isolation and deposition chambers, conveying said substrate into said deposition chamber and isolating said deposition and isolation chambers; and, (j) depositing material on the substrate in said deposition chamber.

* * * * *